United States Patent
Kim

(10) Patent No.: US 10,600,813 B2
(45) Date of Patent: Mar. 24, 2020

(54) DISPLAY DEVICE FABRICATED WITH FEWER MASKS AND METHOD OF MANUFACTURING THE SAME

(71) Applicant: Samsung Display Co., Ltd., Yongin-Si, Gyeonggi-Do (KR)

(72) Inventor: Duksung Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/279,725

(22) Filed: Feb. 19, 2019

(65) Prior Publication Data

US 2019/0189642 A1   Jun. 20, 2019

Related U.S. Application Data

(62) Division of application No. 15/436,638, filed on Feb. 17, 2017, now Pat. No. 10,249,646.

(30) Foreign Application Priority Data

Feb. 18, 2016   (KR) ........................ 10-2016-0019076

(51) Int. Cl.
*H01L 27/12* (2006.01)
*H01L 21/027* (2006.01)
(Continued)

(52) U.S. Cl.
CPC .... *H01L 27/1225* (2013.01); *G02F 1/133345* (2013.01); *G02F 1/136209* (2013.01);
(Continued)

(58) Field of Classification Search
CPC ......... G02F 1/133345; G02F 1/136209; G02F 1/136286; G02F 2001/136222;
(Continued)

(56) References Cited

U.S. PATENT DOCUMENTS 6,407,782 B1 *   6/2002   Kim ................. G02F 1/133516
                                                          349/106
7,989,274 B2 *   8/2011   Kang .................... G02F 1/1333
                                                          438/149

(Continued)

FOREIGN PATENT DOCUMENTS

KR   10-2010-0130104 A   12/2010
KR   10-2010-0132308 A   12/2010
KR   10-2013-0058511 A   6/2013

*Primary Examiner* — Duy T Nguyen
(74) *Attorney, Agent, or Firm* — Innovation Counsel LLP

(57) ABSTRACT

A display device includes: a substrate including first and second light-blocking areas, and a pixel area; a light-blocking pattern at least partially at the first light-blocking area; a data line at the second light-blocking area; a first insulating layer on the light-blocking pattern and the data line; a semiconductor layer on the first insulating layer and overlapping the light-blocking pattern on a plane; a second insulating layer on the semiconductor layer; a color filter on the second insulating layer at least partially at the pixel area; a third insulating layer on the second insulating layer and the color filter; a gate line on the third insulating layer at the first light-blocking area; a pixel electrode at least partially at the pixel area; and a bridge electrode at least partially at the first light-blocking area. The second and third insulating layers directly contact one another over the semiconductor layer.

9 Claims, 13 Drawing Sheets

(51) Int. Cl.
*H01L 21/4757* (2006.01)
*H01L 21/4763* (2006.01)
*H01L 29/786* (2006.01)
*H01L 27/32* (2006.01)
*G02F 1/1333* (2006.01)
*G02F 1/1362* (2006.01)
*H01L 29/24* (2006.01)
*G02F 1/1368* (2006.01)
*H01L 51/52* (2006.01)

(52) U.S. Cl.
CPC .... *G02F 1/136286* (2013.01); *H01L 21/0273* (2013.01); *H01L 21/47573* (2013.01); *H01L 21/47635* (2013.01); *H01L 27/124* (2013.01); *H01L 27/1248* (2013.01); *H01L 27/1259* (2013.01); *H01L 27/1288* (2013.01); *H01L 29/24* (2013.01); *H01L 29/7869* (2013.01); *H01L 29/78633* (2013.01); *G02F 2001/13685* (2013.01); *G02F 2001/136222* (2013.01); *G02F 2001/136231* (2013.01); *G02F 2001/136295* (2013.01); *G02F 2201/123* (2013.01); *H01L 27/322* (2013.01); *H01L 27/3248* (2013.01); *H01L 27/3258* (2013.01); *H01L 27/3262* (2013.01); *H01L 27/3272* (2013.01); *H01L 27/3276* (2013.01); *H01L 51/5284* (2013.01); *H01L 2227/323* (2013.01)

(58) Field of Classification Search
CPC ........ G02F 2001/136231; G02F 2001/136295; G02F 2001/13685; G02F 2201/123; H01L 21/0273; H01L 21/47573; H01L 21/47635; H01L 2227/323; H01L 27/1225; H01L 27/124; H01L 27/1248; H01L 27/1259; H01L 27/1288; H01L 27/322; H01L 27/3248; H01L 27/3258; H01L 27/3262; H01L 27/3272; H01L 27/3276; H01L 29/24; H01L 29/78633; H01L 29/7869; H01L 51/5284
USPC .................................................. 438/22, 28
See application file for complete search history.

(56) References Cited

U.S. PATENT DOCUMENTS

| 2002/0101557 | A1 | 8/2002 | Ono et al. | |
| 2005/0140858 | A1* | 6/2005 | Park | G02F 1/13394 349/110 |
| 2012/0300152 | A1 | 11/2012 | Anjo et al. | |
| 2013/0314636 | A1 | 11/2013 | Chen et al. | |
| 2015/0198842 | A1* | 7/2015 | Kwak | H01L 27/1248 349/42 |
| 2016/0218121 | A1* | 7/2016 | Choung | G02F 1/133514 |
| 2016/0282666 | A1* | 9/2016 | Ro | G02F 1/13454 |

* cited by examiner

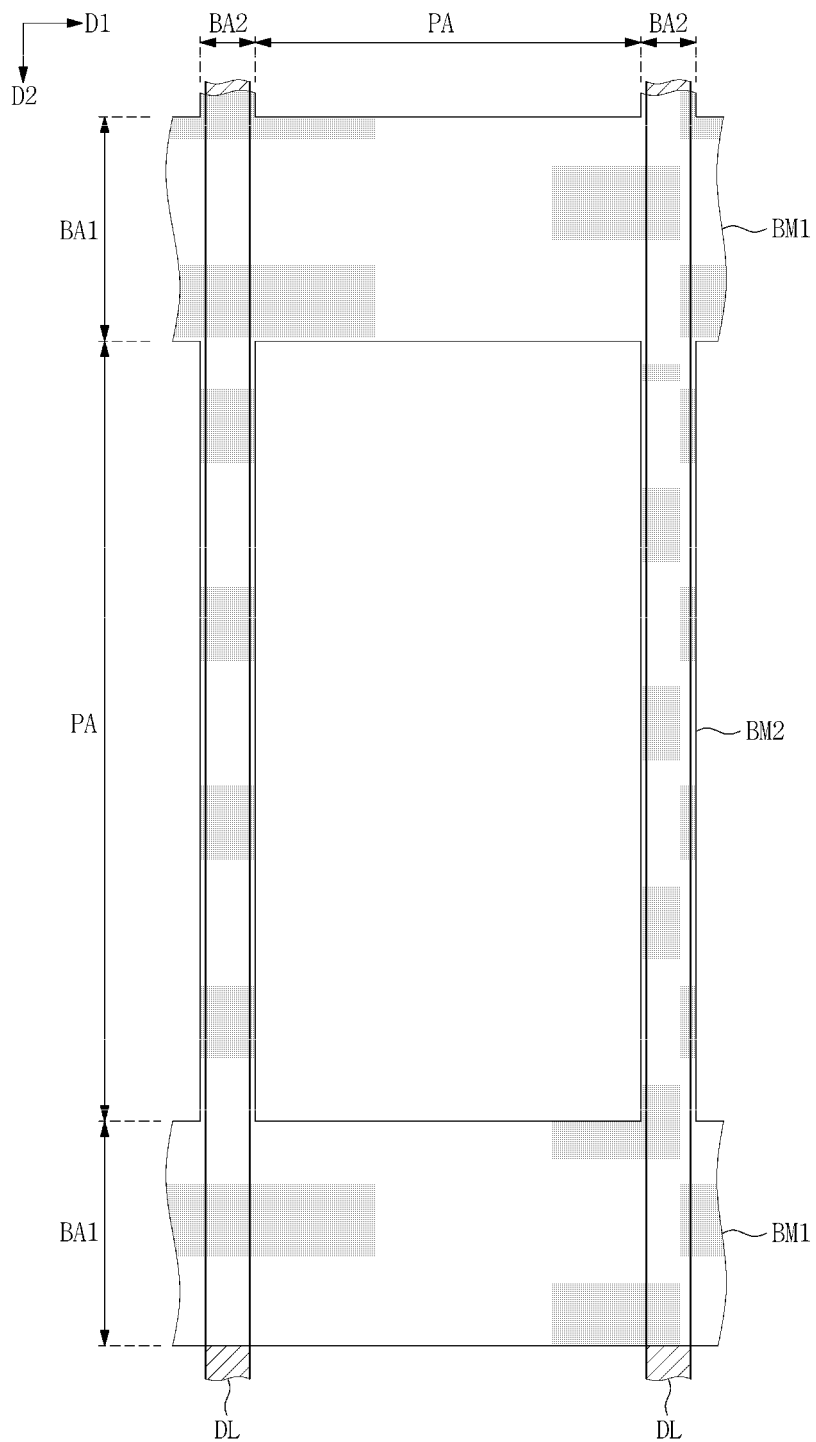

FIG. 9D
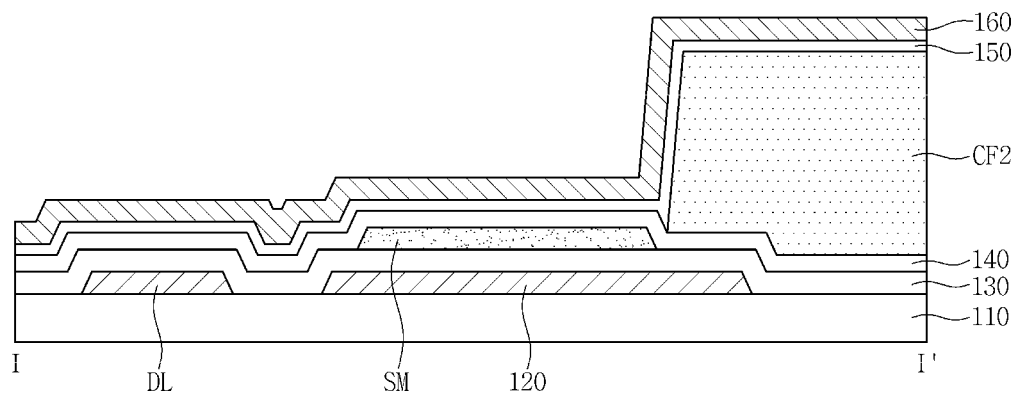
FIG. 9E
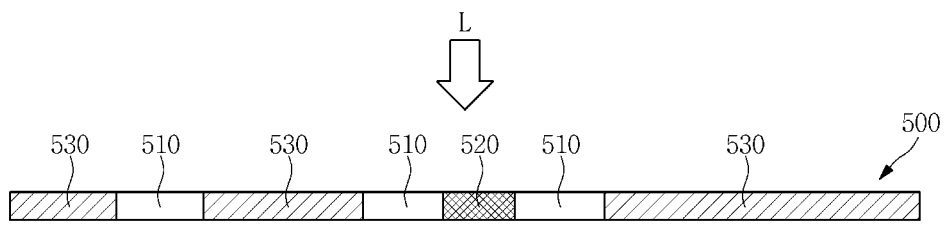
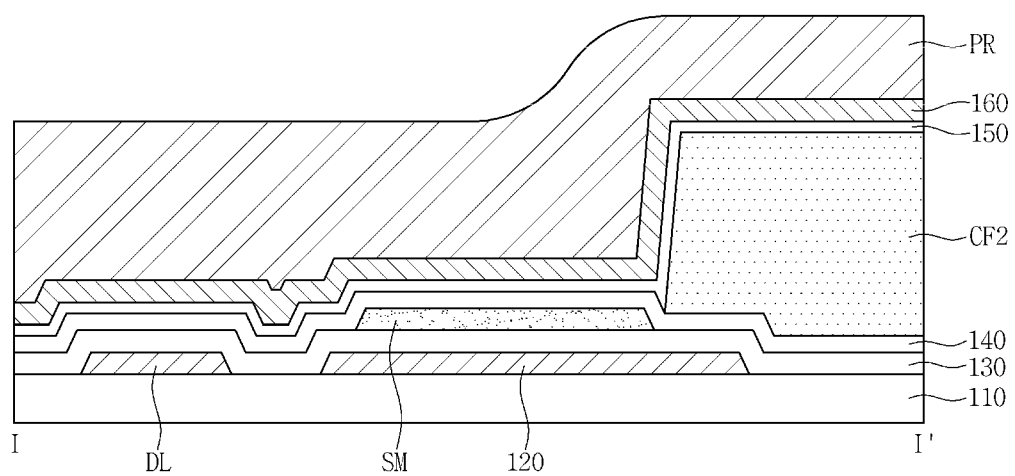

DISPLAY DEVICE FABRICATED WITH FEWER MASKS AND METHOD OF MANUFACTURING THE SAME

CROSS-REFERENCE TO RELATED APPLICATION

This application is a divisional application of U.S. patent application Ser. No. 15/436,638 filed on Feb. 17, 2017, which claims priority under 35 USC § 119 to Korean Patent Application No. 10-2016-0019076 filed on Feb. 18, 2016, in the Korean Intellectual Property Office, the disclosures of which are incorporated herein in their entirety by reference.

BACKGROUND

1. Field

Exemplary embodiments of the invention relate generally to a display device and a method of manufacturing the display device, and more particularly, to a display device capable of being fabricated with a reduced number of masks and a method of manufacturing the display device.

2. Description of the Related Art

Display devices are commonly classified into a liquid crystal display ("LCD") device, an organic light emitting diode ("OLED") display device, a plasma display panel ("PDP") device, an electrophoretic display ("EPD") device, and the like, based on a light emitting scheme thereof.

Such a display device includes a gate line and a data line, and at least one thin film transistor ("TFT") connected to the gate line and the data line. In recent times, a TFT using an oxide semiconductor has been developed. The oxide semiconductor TFT has advantages such as high electric-field mobility, low threshold voltage, low leakage current, or the like, and thus may be applied to various display devices.

The oxide semiconductor TFT may be classified into a top gate type and a bottom gate type TFT, based on the position of its gate electrode. The top gate type oxide semiconductor TFT is widely used by virtue of its advantages: its process temperature is relatively low, a semiconductor process, e.g., laser crystallization, doping, and activation, is not required, and stability is relatively easily achieved.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the invention are directed to a method of manufacturing a display device whereby the number of masks may be reduced, and to a display device manufactured according to such method.

According to an exemplary embodiment of the invention, a display device includes: a base substrate including a first light blocking area extending in a first direction, a second light blocking area extending in a second direction intersecting the first direction, and a pixel area defined by the first light blocking area and the second light blocking area; a light blocking pattern on the base substrate, at least a portion of the light blocking pattern positioned at the first light blocking area; a data line on the base substrate and positioned at the second light blocking area; a first insulating layer on the light blocking pattern and the data line; a semiconductor layer on the first insulating layer, the semiconductor layer overlapping the light blocking pattern on a plane; a second insulating layer on the semiconductor layer; a color filter on the second insulating layer, at least a portion of the color filter positioned at the pixel area, the color filter having an island shape; a third insulating layer on the second insulating layer and the color filter; a gate line on the third insulating layer and positioned at the first light blocking area; a pixel electrode on the third insulating layer, at least a portion of the pixel electrode positioned at the pixel area; and a bridge electrode on the third insulating layer, at least a portion of the bridge electrode positioned at the first light blocking area. The second insulating layer and the third insulating layer directly contact one another over the semiconductor layer.

The color filter may be absent over the semiconductor layer.

The bridge electrode may be connected to the semiconductor layer through both the second insulating layer and the third insulating layer.

The pixel electrode may be connected to the semiconductor layer through both the second insulating layer and the third insulating layer.

The data line may have a multilayer structure.

The data line may include: a first layer including at least one of: an aluminum-based metal, a silver-based metal, and a copper-based metal; and a second layer including at least one of: a molybdenum-based metal, chromium, titanium, and tantalum.

The data line may further include a third layer including at least one of: indium tin oxide (ITO) and indium zinc oxide (IZO).

The light blocking pattern and the data line may be disposed on substantially a same layer.

The display device may further include a black matrix at the first light blocking area and the second light blocking area.

The semiconductor layer may include at least one of: zinc oxide (ZnO), zinc-tin oxide (ZTO), zinc indium oxide (ZIO), indium oxide (InO), titanium oxide (TiO), indium-gallium-zinc oxide (IGZO), and indium-zinc-tin oxide (IZTO).

According to another exemplary embodiment of the present invention, a method of manufacturing a display device includes: receiving a base substrate including a first light blocking area extending in a first direction, a second light blocking area extending in a second direction intersecting the first direction, and a pixel area defined by the first light blocking area and the second light blocking area; forming a light blocking pattern on the base substrate, at least a portion of the light blocking pattern positioned at the first light blocking area; forming a data line on the base substrate and at the second light blocking area; forming a first insulating layer on the light blocking pattern and the data line; forming a semiconductor layer on the first insulating layer to overlap the light blocking pattern on a plane; forming a second insulating layer on the semiconductor layer; forming a color filter on the second insulating layer, at least a portion of the color filter positioned at the pixel area, the color filter having an island shape; forming a third insulating layer on the second insulating layer and the color filter; forming a gate wiring on the third insulating layer and at the first light blocking area; forming a pixel electrode on the third insulating layer, at least a portion of the pixel electrode positioned at the pixel area; and forming a bridge electrode on the third insulating layer, at least a portion of the bridge electrode positioned at the first light blocking area. The second insulating layer and the third insulating layer directly contact one another over the semiconductor layer.

The forming a light blocking pattern and the forming a data line may be performed in substantially a same process.

The forming a data line may further include: forming a first layer including at least one of: an aluminum-based metal, a silver-based metal, and a copper-based metal; and forming a second layer including at least one of: a molybdenum-based metal, chromium, titanium, and tantalum.

The forming a data line further may include: forming a third layer including at least one of: indium tin oxide (ITO) and indium zinc oxide (IZO).

The forming a gate wiring may include: coating a gate wiring-forming material on the third insulating layer; coating a photosensitive composition on the gate wiring-forming material; disposing, above the photosensitive composition, a mask including a light transmissive portion, a semi-light transmissive portion, and a light blocking portion; irradiating light upon the mask so as to generate an exposed photosensitive composition; developing the exposed photosensitive composition to expose the gate wiring-forming material above the data line and above the semiconductor layer; etching the gate wiring-forming material using the developed photosensitive composition; etching the first insulating layer, the second insulating layer, and the third insulating layer on the data line and etching the second insulating layer and the third insulating layer on the semiconductor layer, using the developed photosensitive composition; ashing the developed photosensitive composition to expose the gate wiring-forming material in an area other than a gate wiring-forming area; and etching the gate wiring-forming material using the ashed photosensitive composition.

When the photosensitive composition is a positive type photoresist, the light transmissive portion may be disposed above the data line and above the semiconductor layer, and the light blocking portion may be disposed above the gate wiring-forming area.

When the photosensitive composition is a negative type photoresist, the light transmissive portion may be disposed above the gate wiring-forming area, and the light blocking portion may be disposed above the data line and above the semiconductor layer.

The gate wiring-forming material may be wet-etched.

The first, second, and third insulating layers may be dry-etched.

The forming a pixel electrode and the forming a bridge electrode may be performed in substantially a same process.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which:

FIG. 8 is a plan view illustrating an exemplary embodiment of a black matrix; and FIGS. 9A, 9B, 9C, 9D, 9E, 9F, 9G, 9H, 9I, 9J, and 9K are cross-sectional views illustrating an exemplary embodiment of a method of manufacturing a display device.

DETAILED DESCRIPTION

Figure 1:
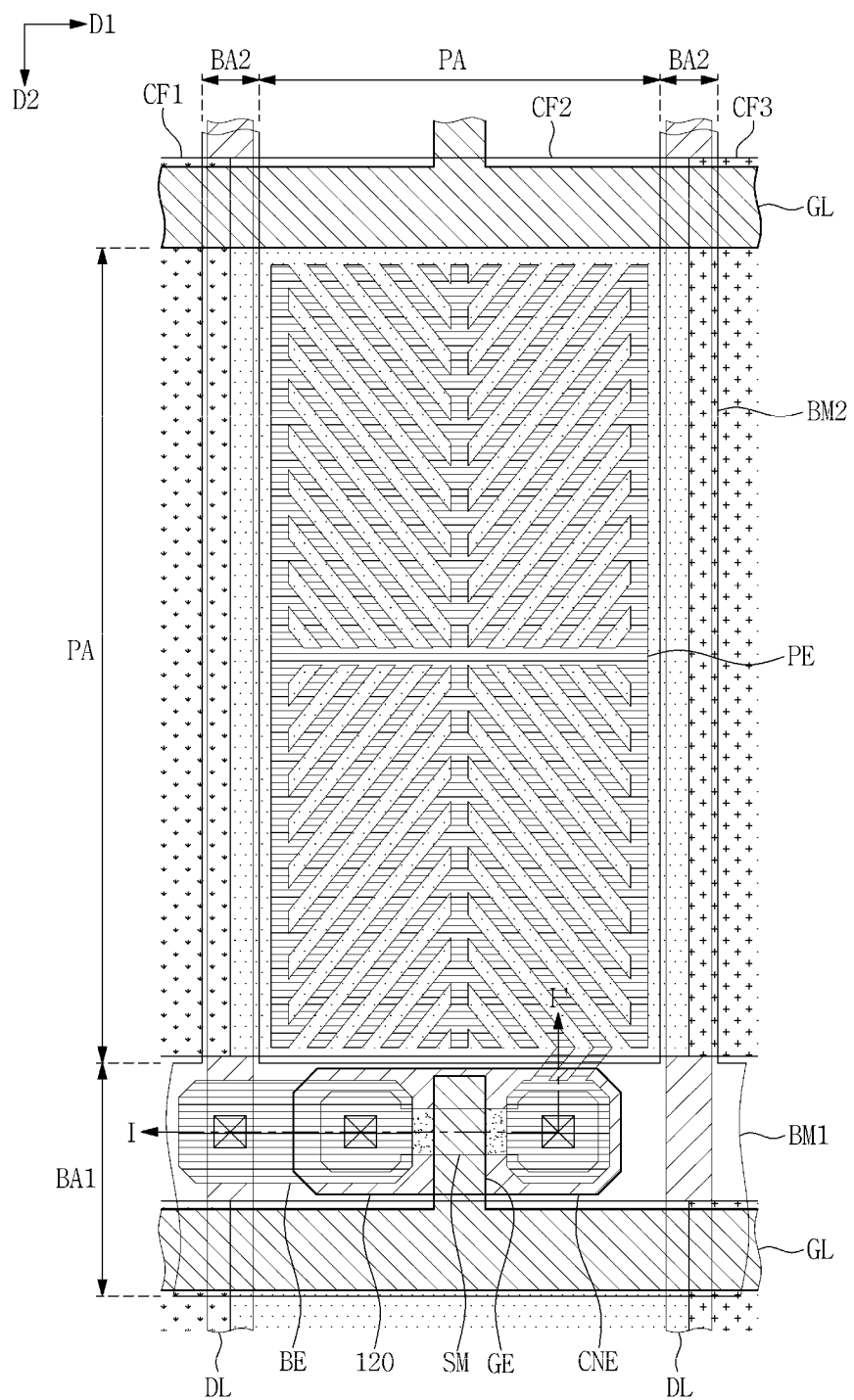
FIG. 1 is a schematic plan view illustrating an exemplary embodiment a display device.

Exemplary embodiments will now be described more fully hereinafter with reference to the accompanying drawings. Although the invention can be modified in various manners and have several embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on their orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention, and like reference numerals refer to like elements throughout the specification. The drawings may not be to scale. All numerical values are approximate, and may vary. All examples of specific materials and compositions are to be taken as nonlimiting and exemplary only. Other suitable materials and compositions may be used instead.

Hereinafter, an exemplary embodiment is described under the assumption that a display device is a liquid crystal display ("LCD") device, but the scope of the present invention is not limited thereto. Exemplary embodiments may be applied to an organic light emitting diode ("OLED") display device.

Figure 2:
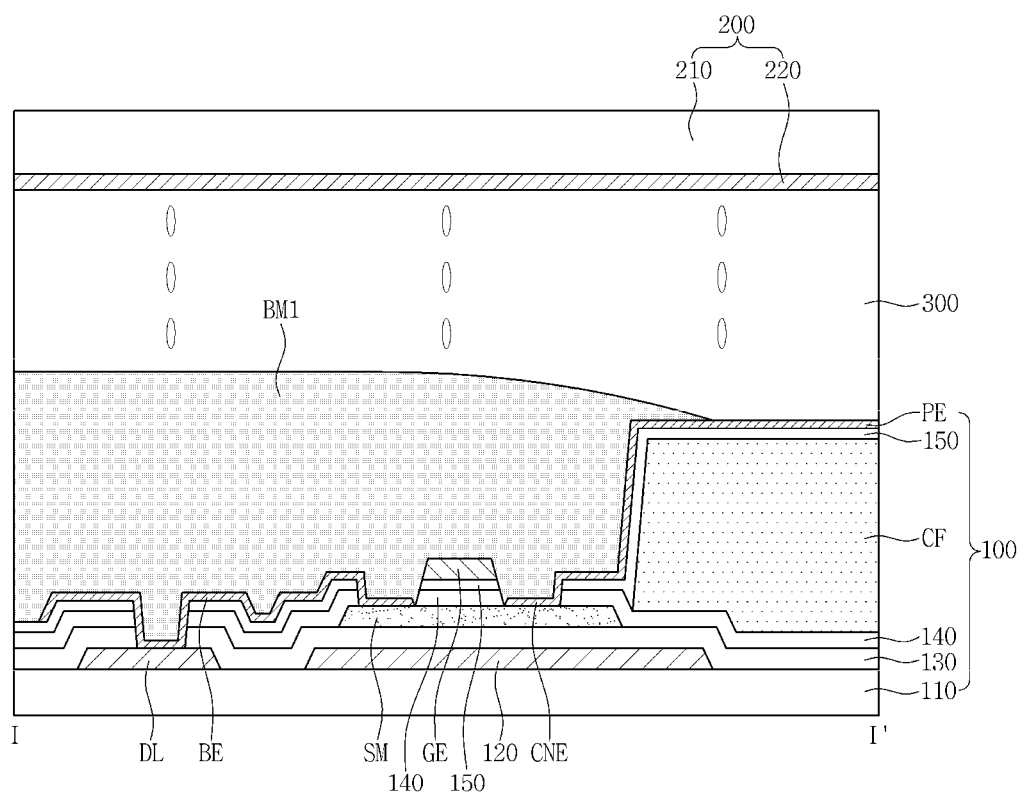
FIG. 2 is a cross-sectional view taken along line I-I' of FIG. 1.

FIG. 1 is a schematic plan view illustrating an exemplary embodiment a display device, and FIG. 2 is a cross-sectional view taken along line I-I' of FIG. 1.

Referring to FIGS. 1 and 2, an exemplary embodiment of a display device includes a display substrate 100, an opposing substrate 200, and a liquid crystal layer 300 between the display substrate 100 and the opposing substrate 200. Further, an exemplary embodiment of a display device may further include a backlight unit (not illustrated) which outputs light toward the display substrate 100.

The display substrate 100 includes a base substrate 110, a light blocking pattern 120, a data line DL, a first insulating layer 130, a semiconductor layer SM, a second insulating layer 140, a color filter CF, a third insulating layer 150, a gate wiring GL and GE, a pixel electrode PE, a bridge electrode BE, black matrixes BM1 and BM2, or the like.

The base substrate 110 may be an insulating substrate, such as a plastic substrate, which has light transmitting characteristics and flexibility. However, exemplary embodiments are not limited thereto, and the base substrate 110 may include a hard substrate such as a glass substrate.

The base substrate 110 includes a first light blocking area BA1 extending in a first direction D1, a second light blocking area BA2 extending in a second direction D2 intersecting the first direction D1, and a pixel area PA defined by the first light blocking area BA1 and the second light blocking area BA2.

Figure 3:
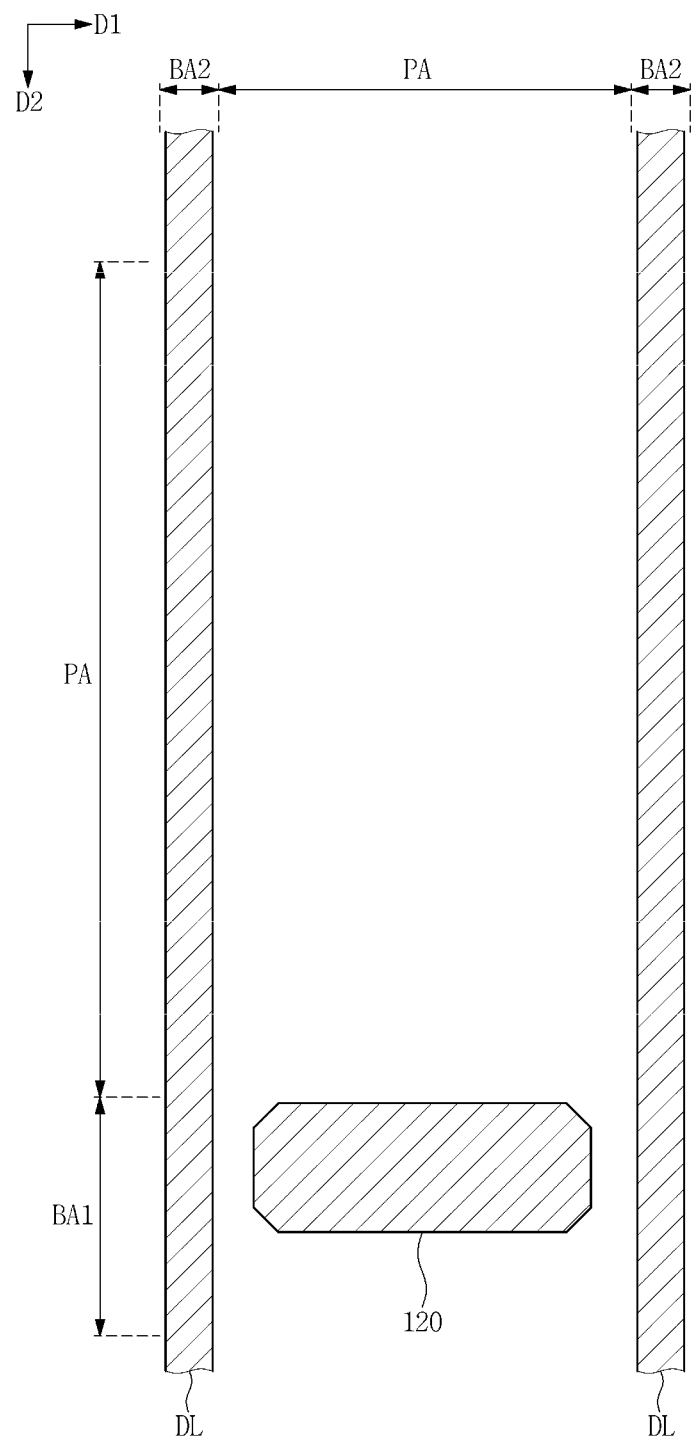
FIG. 3 is a plan view illustrating an exemplary embodiment of a light blocking pattern and a data line.

FIG. 3 is a plan view illustrating an exemplary embodiment of a light blocking pattern and a data line.

Referring to FIGS. 1, 2, and 3, the light blocking pattern 120 is disposed on the base substrate 110 and at least a portion of the light blocking pattern 120 is disposed at the first light blocking area BA1, and the data line DL is disposed on the base substrate 110 at the second light blocking area BA2.

The light blocking pattern 120 is disposed below the semiconductor layer SM, to be described below, and may block light incident to the semiconductor layer SM from the backlight unit.

The light blocking pattern 120 may receive a ground voltage or a storage voltage from, e.g., an external source. In addition, the light blocking pattern 120 may be floated, not receiving a voltage.

The light blocking pattern 120 may include a material that may absorb and block light. For example, the light blocking pattern 120 may include at least one (or any combination) selected from the group consisting of: aluminum (Al) or alloys thereof, silver (Ag) or alloys thereof, copper (Cu) or alloys thereof, molybdenum (Mo) or alloys thereof, chromium (Cr), tantalum (Ta), titanium (Ti), or the like.

The data line DL is disposed to extend in the second direction D2.

The data line DL may have a multilayer structure including two or more conductive layers (not illustrated) having different physical properties.

For example, the data line DL may include a first layer including at least one (or any combination) selected from the group consisting of an aluminum-based metal, a silver-based metal, and a copper-based metal and a second layer including at least one (or any combination) selected from the group consisting of a molybdenum-based metal, chromium, titanium, and tantalum.

In addition, the data line DL may further include a third layer including at least one (or any combination) selected from the group consisting of indium tin oxide (ITO) and indium zinc oxide (IZO).

Examples of the multilayer structure may include a first layer including aluminum and a second layer including chromium, a first layer including molybdenum and a second layer including aluminum, and a first layer including copper and a second layer including titanium. In addition, examples of the multilayer structure may include a first layer including copper, a second layer including titanium, and a third layer including ITO.

The light blocking pattern 120 and the data line DL may be simultaneously formed in substantially a same process.

The first insulating layer 130 is disposed on the base substrate 110 on which the light blocking pattern 120 and the data line DL are disposed. The first insulating layer 130 may also be referred to as a buffer layer. The first insulating layer 130 may include silicon oxide ($SiO_x$) or silicon nitride ($SiN_x$). In addition, the first insulating layer 130 may further include aluminum oxide, titanium oxide, tantalum oxide, or zirconium oxide.

Figure 4:
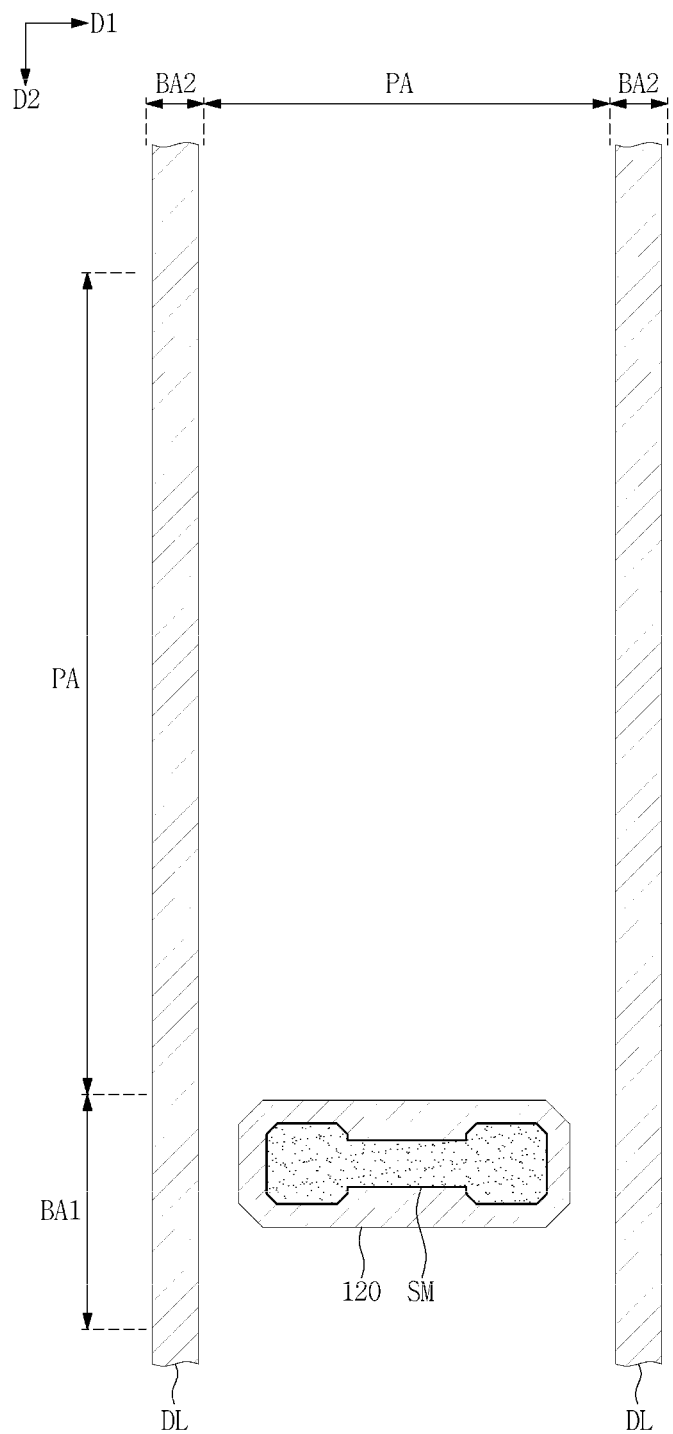
FIG. 4 is a plan view illustrating an exemplary embodiment of a semiconductor layer.

FIG. 4 is a plan view illustrating an exemplary embodiment of a semiconductor layer.

Referring to FIGS. 1, 2, and 4, the semiconductor layer SM is disposed on the first insulating layer 130. The semiconductor layer SM is disposed to overlap the light blocking pattern 120 on a plane. The semiconductor layer SM may include an oxide semiconductor material.

The oxide semiconductor material is a metal oxide semiconductor, and may include an oxide of a metal, such as zinc (Zn), indium (In), gallium (Ga), tin (Sn), or titanium (Ti), or a composition of a metal, such as zinc (Zn), indium (In), gallium (Ga), tin (Sn), or titanium (Ti), and an alloy thereof.

For example, the oxide semiconductor material may include at least one of (or any combination of): zinc oxide (ZnO), zinc-tin oxide (ZTO), zinc indium oxide (ZIO), indium oxide (InO), titanium oxide (TiO), indium-gallium-zinc oxide (IGZO), and indium-zinc-tin oxide (IZTO).

The second insulating layer 140 is disposed on the base substrate 110 on which the semiconductor layer SM is disposed. The second insulating layer 140 may include silicon oxide ($SiO_x$) or silicon nitride ($SiN_x$).

Figure 5:
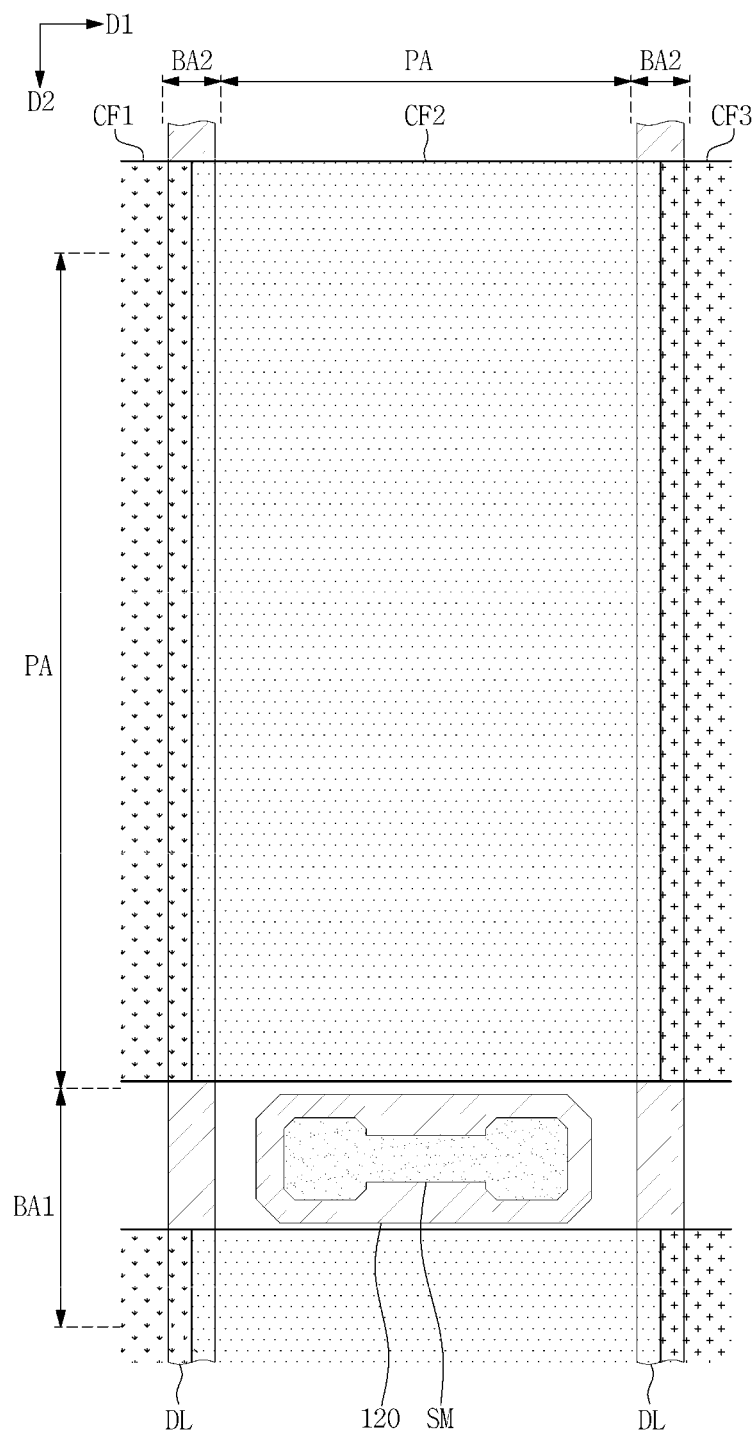
FIG. 5 is a plan view illustrating an exemplary embodiment of a color filter.

FIG. 5 is a plan view illustrating an exemplary embodiment of a color filter.

Referring to FIGS. 1, 2, and 5, color filters CF1, CF2, and CF3 are disposed on the second insulating layer 140 and at least a portion of each of the color filters CF1, CF2, and CF3 is disposed at the pixel area PA. The color filters CF1, CF2, and CF3 may be disposed as an island shape in respective ones of the pixel areas PA. The color filters CF1, CF2, and CF3 may be disposed to extend to portions of the first and second light blocking areas BA1 and BA2 that are adjacent to the pixel area PA, but not on the semiconductor layer SM. The color filters CF1, CF2, and CF3 that are adjacent to one another may overlap one another or be spaced apart from one another.

Each of the color filters CF1, CF2, and CF3 may be one of: a red color filter, a green color filter, a blue color filter, a cyan color filter, a magenta color filter, a yellow color filter, and a white color filter. Three primary colors of red, green and blue, or cyan, magenta, and yellow may define a basic pixel group for representing a color, although any colors and combinations thereof are contemplated.

The third insulating layer 150 is disposed on the base substrate 110 on which the color filters CF1, CF2, and CF3 are disposed. The third insulating layer 150 may include silicon oxide ($SiO_x$) or silicon nitride ($SiN_x$). Because the color filters CF1, CF2, and CF3 are absent on the semiconductor layer SM, the second insulating layer 140 and the third insulating layer 150 may directly contact one another on the semiconductor layer SM.

Figure 6:
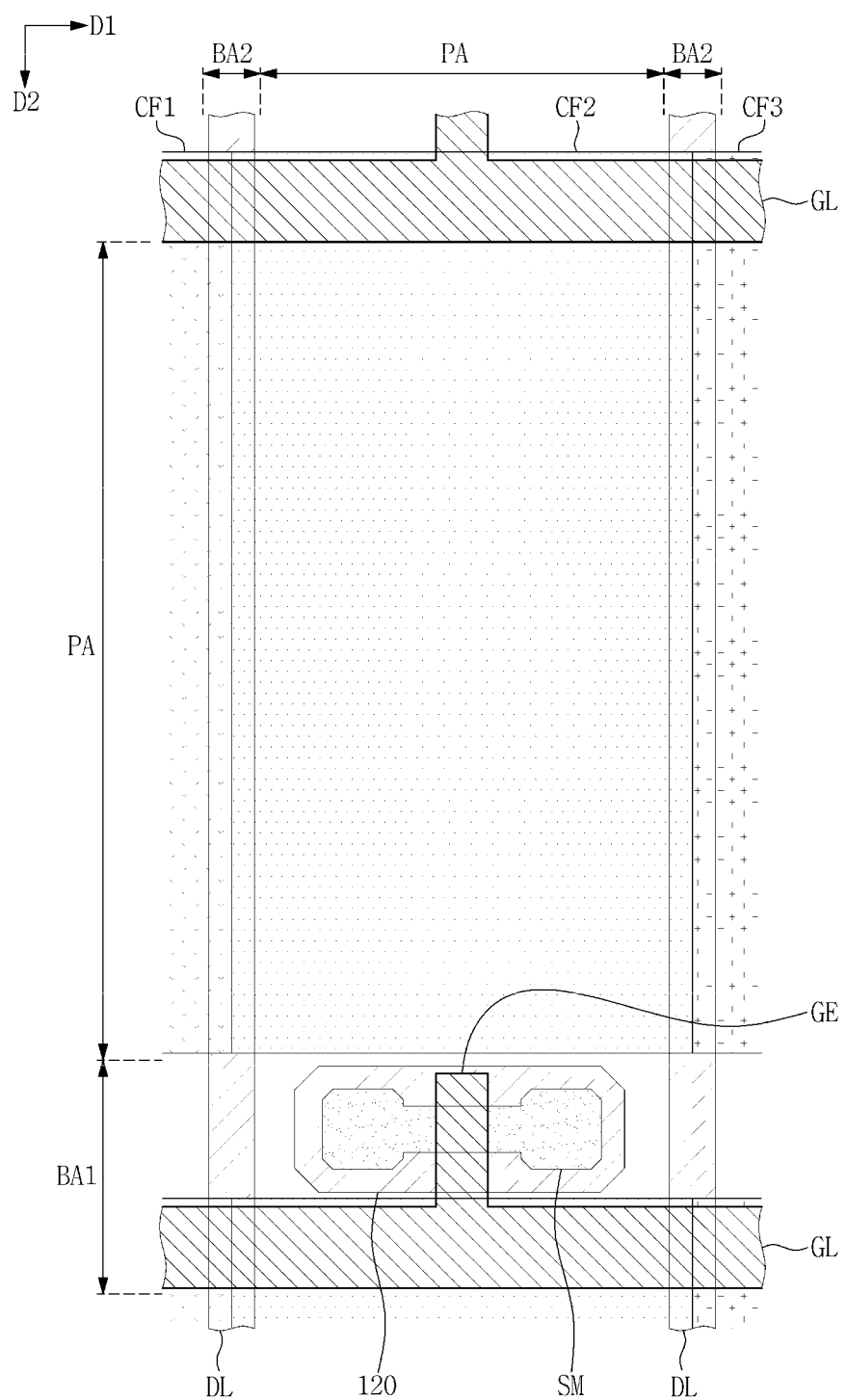
FIG. 6 is a plan view illustrating an exemplary embodiment of a gate wiring.

FIG. 6 is a plan view illustrating an exemplary embodiment of a gate wiring.

Referring to FIGS. 1, 2, and 6, a gate wiring is disposed on the third insulating layer 150 at the first light blocking area BA1. This gate wiring includes a gate line GL extending in the first direction D1, and a gate electrode GE branching off from the gate line GL to overlap the semiconductor layer SM. The gate wiring and the data line DL may include substantially a same material.

Figure 7:
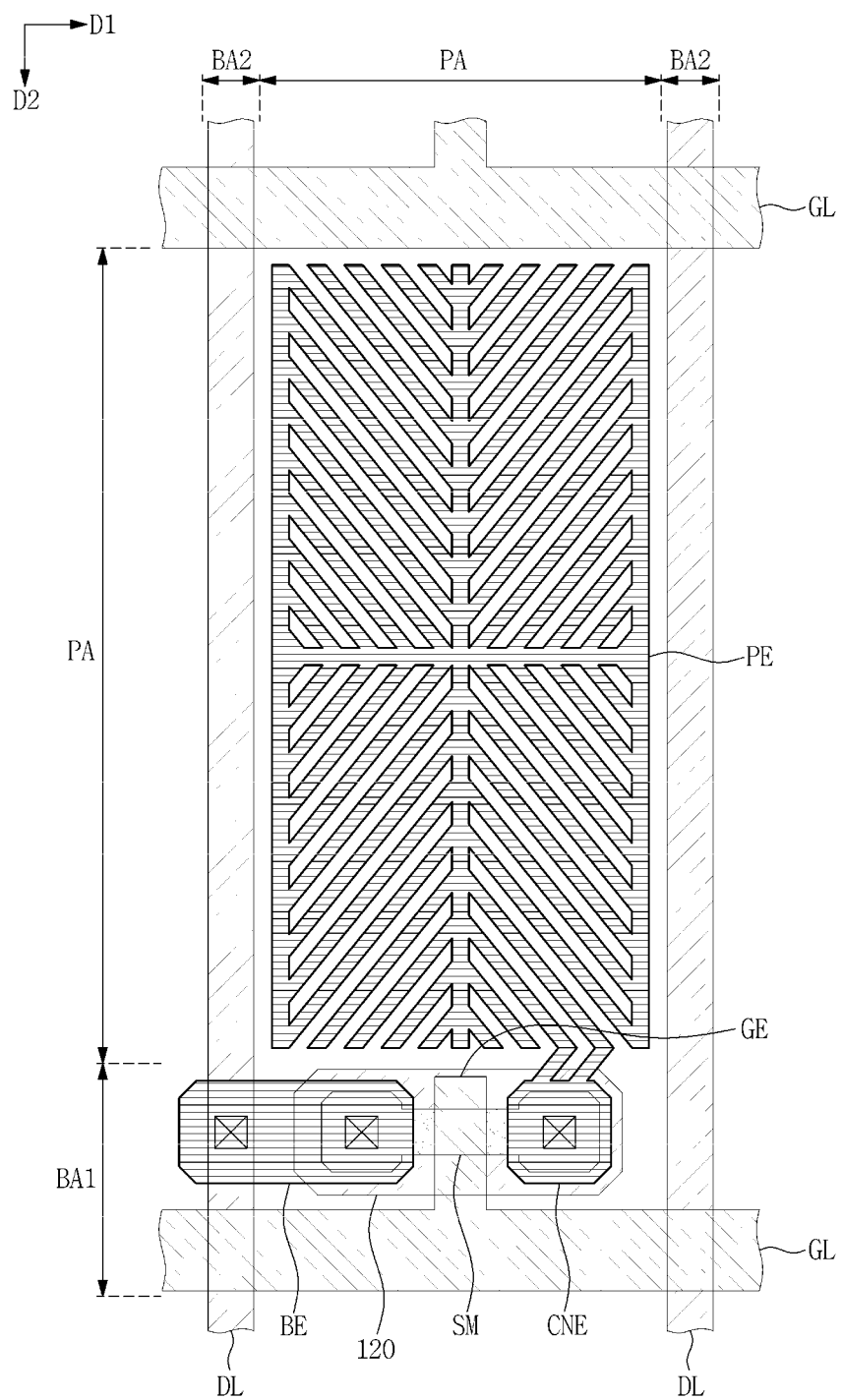
FIG. 7 is a plan view illustrating an exemplary embodiment of a pixel electrode and a bridge electrode.

FIG. 7 is a plan view illustrating an exemplary embodiment of a pixel electrode and a bridge electrode.

Referring to FIGS. 1, 2, and 7, the pixel electrode PE is disposed on the third insulating layer 150 and at least a portion of the pixel electrode PE is disposed at the pixel area PA. An exemplary embodiment is described in which the pixel electrode PE includes a stem portion having a cross shape, and a plurality of branch portions extending from the cross-shaped stem portion. However, exemplary embodiments are not limited thereto, and any pixel electrode having any suitable shape may be applicable to any exemplary embodiment of the invention without limitation.

The pixel electrode PE may further include a connection electrode CNE branching off from the branch portion toward the first light blocking area BA1, and the connection electrode CNE passes through the second insulating layer 140 and the third insulating layer 150 to connect the pixel electrode PE and the semiconductor layer SM.

The bridge electrode BE is disposed on the third insulating layer 150 and at least a portion of the bridge electrode BE is disposed at the first light blocking area BA1. The bridge electrode BE passes through the first insulating layer 130, the second insulating layer 140, and the third insulating layer 150 to connect the data line DL and the semiconductor layer SM.

The pixel electrode PE, the connection electrode CNE, and the bridge electrode BE may include a transparent conductive material. For example, the pixel electrode PE may include a transparent conductive material such as indium tin oxide (ITO), indium zinc oxide (IZO), indium tin zinc oxide (ITZO), or aluminum zinc oxide (AZO).

The pixel electrode PE, the connection electrode CNE, and the bridge electrode BE may be simultaneously provided in substantially a same process.

FIG. 8 is a plan view illustrating an exemplary embodiment of a black matrix.

Referring to FIGS. 1, 2, and 8, the black matrixes BM1 and BM2 are disposed on the base substrate 110 on which the pixel electrode PE, the connection electrode CNE, and the bridge electrode BE are formed.

The black matrixes BM1 and BM2 include a first black matrix BM1 positioned at the first light blocking area BA1 and extending in the first direction D1, and a second black matrix BM2 positioned at the second light blocking area BA2 and extending in the second direction D2. In an alternative exemplary embodiment, the second black matrix BM2 may be omitted.

The black matrixes BM1 and BM2 may include or be formed of a photosensitive composition. Examples of the photosensitive composition may include: a binder resin, a polymerizable monomer, a polymerizable oligomer, a pigment, a dispersant, and a photoinitiator. The pigment may use a black pigment, a black resin, or the like.

A lower alignment layer (not illustrated) may be disposed on the pixel electrode PE and the black matrixes BM1 and BM2. The lower alignment layer may be a homeotropic alignment layer or a photoalignment layer including a photopolymerizable material.

The opposing substrate 200 may include an opposing base substrate 210, a common electrode 220, or the like.

The opposing base substrate 210 may be an insulating substrate, e.g., a plastic substrate, which has light transmitting characteristics and flexibility. However, exemplary embodiments are not limited thereto, and the opposing base substrate 210 may include a hard substrate such as a glass substrate.

The common electrode 220 may be a whole planar electrode (e.g. a single unitary electrode covering substantially the entire display area) including a transparent conductor such as indium tin oxide (ITO) or indium zinc oxide (IZO). In an alternative exemplary embodiment, the common electrode 220 may have an uneven portion and/or at least one slit, in order to define a plurality of domains.

An upper alignment layer (not illustrated) may be disposed on the common electrode 220. The upper alignment layer (not illustrated) may be a homeotropic alignment layer or a photoalignment layer including a photopolymerizable material.

FIGS. 9A, 9B, 9C, 9D, 9E, 9F, 9G, 9H, 9I, 9J, and 9K are cross-sectional views illustrating an exemplary embodiment of a method of manufacturing a display device.

Figure 9A:
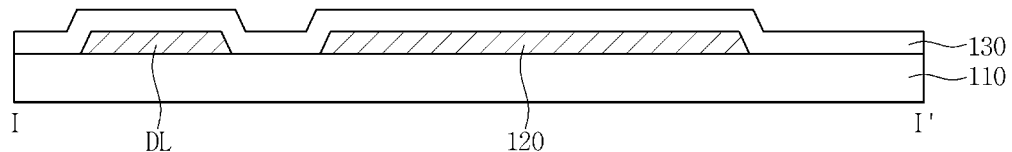

Referring to FIGS. 3 and 9A, the data line DL and the light blocking pattern 120 are formed on the base substrate 110.

The data line DL may be formed through a process of forming a first layer which includes at least one (or any combination) selected from the group consisting of an aluminum-based metal, a silver-based metal, and a copper-based metal, and a process of forming a second layer which includes at least one (or any combination) selected from the group consisting of a molybdenum-based metal, chromium, titanium, and tantalum. In addition, the data line DL may be formed further through a process of forming a third layer including at least one (or any combination) selected from the group consisting of indium tin oxide (ITO) and indium zinc oxide (IZO).

The data line DL and the light blocking pattern 120 may be simultaneously formed in substantially a same process. The first insulating layer 130 is formed over an entire surface of the base substrate 110 on which the data line DL and the light blocking pattern 120 are formed.

Figure 9B:
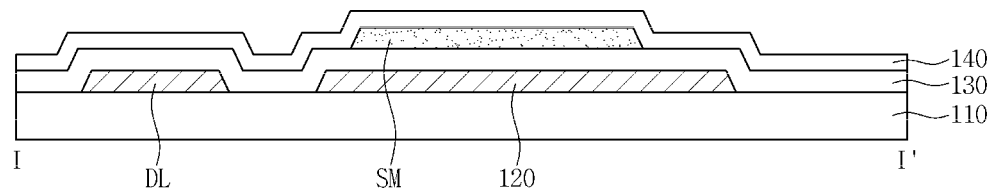

Referring to FIGS. 4 and 9B, the semiconductor layer SM is formed on the first insulating layer 130. The semiconductor layer SM may be formed to overlap the light blocking pattern 120 on a plane. The semiconductor layer SM may include at least one (or any combination) selected from the group consisting of: zinc oxide (ZnO), zinc-tin oxide (ZTO), zinc indium oxide (ZIO), indium oxide (InO), titanium oxide (TiO), indium-gallium-zinc oxide (IGZO), or indium-zinc-tin oxide (IZTO).

The second insulating layer 140 is formed over the entire surface of the base substrate 110 on which the semiconductor layer SM is formed.

Figure 9C:
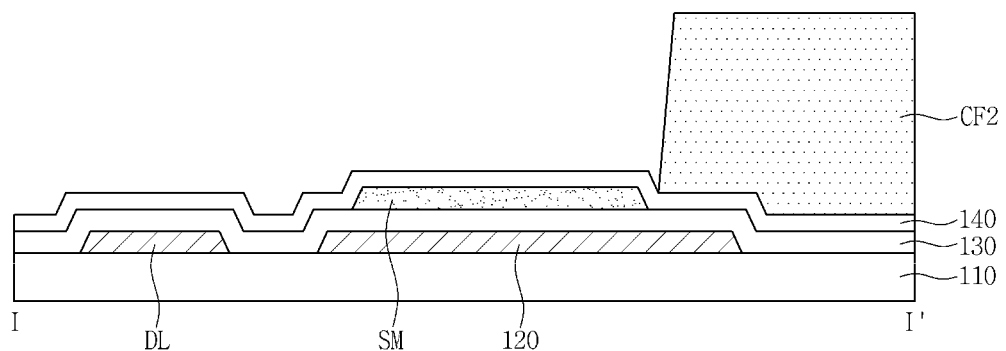

Referring to FIGS. 5 and 9C, the color filters CF1, CF2, and CF3 are formed on the second insulating layer 140 and at least a portion of each of the color filters CF1, CF2, and CF3 is disposed at the pixel area PA. The color filters CF1, CF2, and CF3 may be disposed to extend to portions of the first and second light blocking areas BA1 and BA2 that are adjacent to the pixel area PA, but not on the semiconductor layer SM.

Referring to FIG. 9D, the third insulating layer 150 is formed on the base substrate 110 on which the color filters CF1, CF2, and CF3 are formed, and subsequently, a gate wiring-forming material 160 is formed thereon. The gate wiring-forming material 160 may be formed using one of the following methods: an ion beam deposition process, a spin coating process, a printing process, a sputtering process, a chemical vapor deposition process, an atomic layer deposition process, a plasma enhanced chemical vapor deposition process, a high-density plasma-chemical vapor deposition process, or a vacuum deposition process.

Referring to FIG. 9E, a photosensitive composition PR is coated on the base substrate 110 on which the gate wiring-forming material 160 is formed.

The photosensitive composition PR may be a positive type or a negative type photosensitive resin composition. Hereinbelow, it is assumed that the photosensitive composition PR is a positive type photosensitive composition in which an exposed portion is developed and a non-exposed portion remains.

The photosensitive composition PR may include a binder resin, a polymerizable monomer, a polymerizable oligomer, a pigment, a dispersant, and a photoinitiator, for example. The pigment may use a black pigment, a black resin, or the like.

A mask 500 is disposed on the photosensitive composition PR to be spaced apart from the photosensitive composition PR, and a light L is irradiated to the photosensitive composition PR through the mask 500 such that light exposure occurs. The mask 500 is a three-tone mask including, e.g., a light transmissive portion 510, a light blocking portion 520, and a semi-light transmissive portion 530, respectively having different light transmittances. In an alternative exemplary embodiment, the mask 500 may have a slit portion in lieu of the semi-light transmissive portion 530.

The light transmissive portion 510 may have a light transmittance of about 95 percent (%) or higher, the light blocking portion 520 may have a light transmittance of about 5% or lower, and the semi-light transmissive portion 530 may have a light transmittance in a range of about 15% to about 20%.

The light transmissive portion 510 is disposed above the data line DL and above the semiconductor layer SM, the light blocking portion 520 is disposed above a gate wiring-forming area, and the semi-light transmissive portion 530 is disposed above remaining areas.

In an alternative exemplary embodiment, in a case where the photosensitive composition PR is a negative type photosensitive composition, the light transmissive portion 510 is disposed above the gate wiring-forming area, the light blocking portion 520 is disposed above the data line DL and above the semiconductor layer SM, and the semi-light transmissive portion 530 is disposed above remaining areas.

Figure 9F:
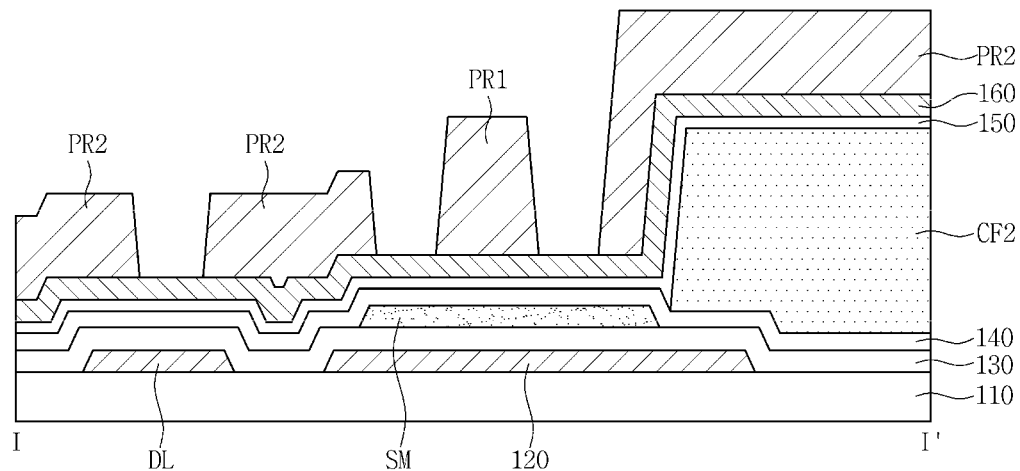

Referring to FIGS. 9E and 9F, the photosensitive composition PR below the light transmissive portion 510 is completely removed, and the photosensitive composition PR below the light blocking portion 520 is developed and cured intact, such that a first etching prevention layer PR1 is formed.

A portion of the photosensitive composition PR below the semi-light transmissive portion 530 is removed, and another portion of the photosensitive composition PR below the semi-light transmissive portion 530 is developed and cured such that a second etching prevention layer PR2 is formed. Accordingly, the first etching prevention layer PR1 may have a greater thickness than a thickness of the second etching prevention layer PR2. A portion of the gate wiring-forming material 160 is exposed between portions of the first etching prevention layer PR1 and the second etching prevention layer PR2.

Figure 9G:
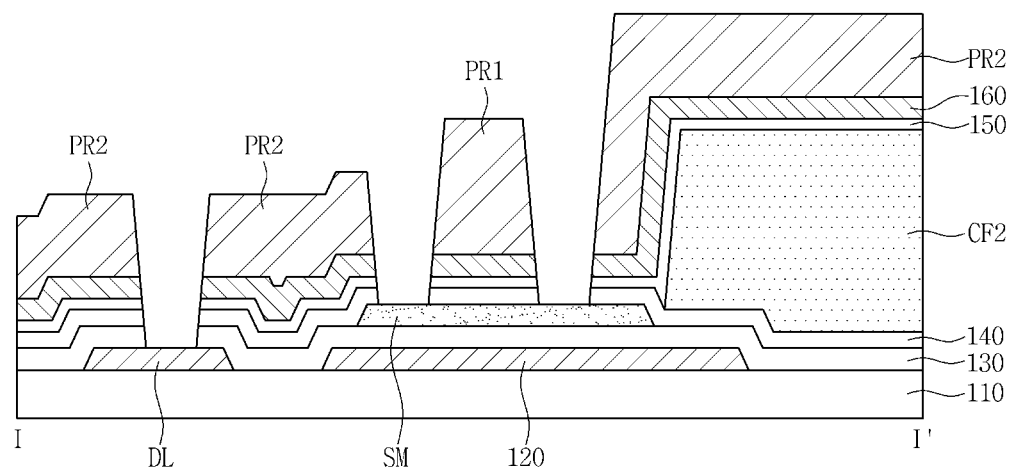

Referring to FIG. 9G, the exposed portion of the gate wiring-forming material 160 is etched. The gate wiring-forming material 160 may be etched through wet-etching.

Subsequently, at least portions of the third insulating layer 150, the second insulating layer 140, and the first insulating layer 130 that lie on the data line DL are sequentially etched, thereby exposing a portion of the data line DL. Similarly, at least portions of the third insulating layer 150 and the second insulating layer 140 over the semiconductor layer SM are sequentially etched, thereby exposing a portion of the semiconductor layer SM.

The first insulating layer 130, the second insulating layer 140, and the third insulating layer 150 may be etched through dry-etching.

Figure 9H:
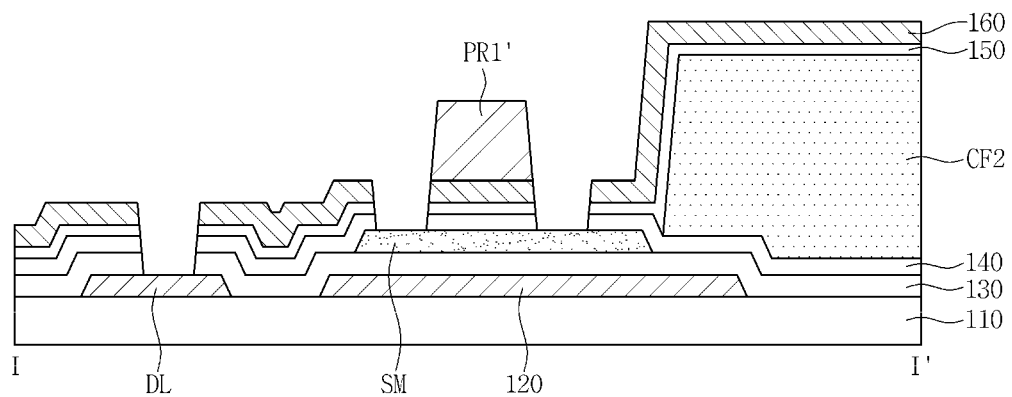

Referring to FIGS. 9G and 9H, the first etching prevention layer PR1 and the second etching prevention layer PR2 are ashed. Accordingly, a portion of the first etching prevention layer PR1 is removed such that a first etching prevention layer PR1' is formed. The second etching prevention layer PR2 is completely removed, such that the gate wiring-forming material 160 is exposed in areas other than the gate wiring-forming area.

Figure 9I:
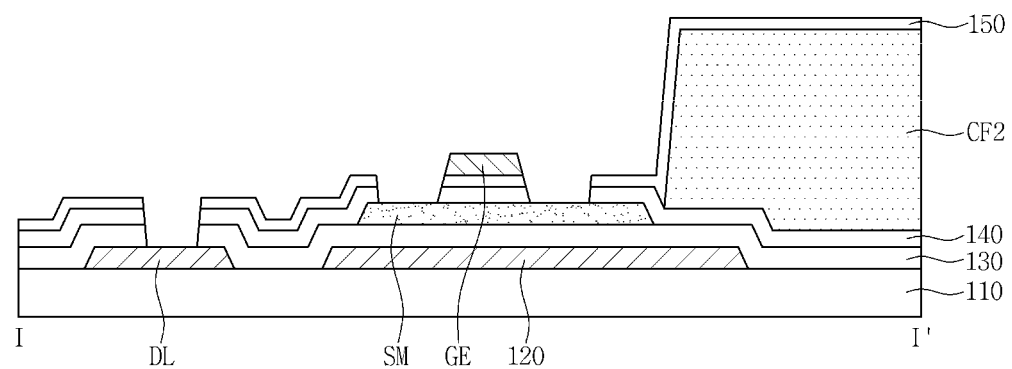

Referring to FIGS. 6 and 9I, the exposed portion of the gate wiring-forming material 160 is etched such that the gate wiring GL and GE is formed. The gate wiring-forming material 160 may be etched through wet-etching.

In such an exemplary embodiment, the data line DL is provided as a multilayer structure, and thus although an upper portion of an exposed portion of the data line DL is damaged, functional degradation of the data line DL may be significantly reduced (e.g., minimized).

Figure 9J:
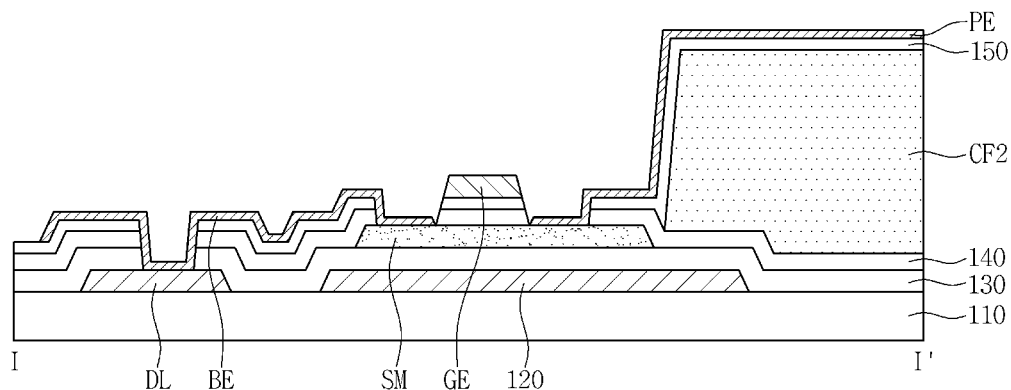

Referring to FIGS. 7 and 9J, the pixel electrode PE is formed on the third insulating layer 150 and at least a portion of the pixel electrode PE is formed at the pixel area PA. The bridge electrode BE is formed on the third insulating layer 150 and at least a portion of the bridge electrode BE is disposed at the first light blocking area BA1.

Figure 9K:
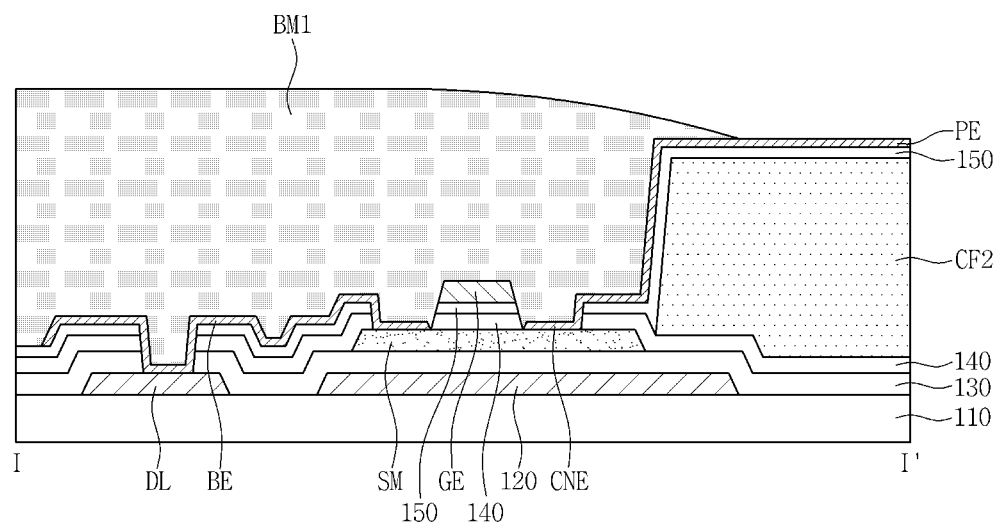

Referring to FIGS. 8 and 9K, the black matrixes BM1 and BM2 are formed at the light blocking areas BA1 and BA2.

An exemplary embodiment of a display device uses a three-tone mask, and thus the number of masks may be reduced, a process may be simplified, and a manufacturing cost may be reduced.

As set forth hereinabove, in one or more exemplary embodiments, a display device and a method of manufacturing the display device may reduce the number of masks such that a process may be simplified and a manufacturing cost may be reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A method of manufacturing a display device, the method comprising:
    receiving a base substrate comprising a first light blocking area extending in a first direction, a second light blocking area extending in a second direction intersecting the first direction, and a pixel area defined by the first light blocking area and the second light blocking area;
    forming a light blocking pattern on the base substrate, at least a portion of the light blocking pattern positioned at the first light blocking area;
    forming a data line on the base substrate and at the second light blocking area;
    forming a first insulating layer on the light blocking pattern and the data line;
    forming a semiconductor layer on the first insulating layer to overlap the light blocking pattern on a plane;
    forming a second insulating layer on the semiconductor layer;
    forming a color filter on the second insulating layer, the color filter having an island shape and at least a portion of the color filter positioned at the pixel area;
    forming a third insulating layer on the second insulating layer and the color filter;
    forming a gate wiring on the third insulating layer and at the first light blocking area;
    forming a pixel electrode on the third insulating layer, at least a portion of the pixel electrode positioned at the pixel area; and
    forming a bridge electrode on the third insulating layer, at least a portion of the bridge electrode positioned at the first light blocking area,
    wherein the second insulating layer and the third insulating layer directly contact one another over the semiconductor layer.

2. The method as claimed in claim 1, wherein the forming a light blocking pattern and the forming a data line are performed in substantially a same process.

3. The method as claimed in claim 1, wherein the forming a data line further comprises:
    forming a first layer comprising at least one of: an aluminum-based metal, a silver-based metal, and a copper-based metal; and
    forming a second layer comprising at least one of: a molybdenum-based metal, chromium, titanium, and tantalum.

4. The method as claimed in claim 3, wherein the forming a data line further comprises: forming a third layer comprising at least one of: indium tin oxide (ITO) and indium zinc oxide (IZO).

5. The method as claimed in claim 1, wherein the forming a gate wiring comprises:
    coating a gate wiring-forming material on the third insulating layer;
    coating a photosensitive composition on the gate wiring-forming material;
    disposing, above the photosensitive composition, a mask comprising a light transmissive portion, a semi-light transmissive portion, and a light blocking portion;
    irradiating light upon the mask so as to generate an exposed photosensitive composition;
    developing the exposed photosensitive composition to expose the gate wiring-forming material above the data line and above the semiconductor layer;
    etching the gate wiring-forming material using the developed photosensitive composition;
    etching the first insulating layer, the second insulating layer, and the third insulating layer on the data line and etching the second insulating layer and the third insulating layer on the semiconductor layer, using the developed photosensitive composition;
    ashing the developed photosensitive composition to expose the gate wiring-forming material in an area other than a gate wiring-forming area; and
    etching the gate wiring-forming material using the ashed photosensitive composition.

6. The method as claimed in claim 5, wherein the photosensitive composition is a positive type photoresist, wherein the light transmissive portion is disposed above the data line and above the semiconductor layer, and wherein the light blocking portion is disposed above the gate wiring-forming area.

7. The method as claimed in claim 5, wherein the etching the gate wiring-forming material further comprises wet-etching the gate wiring-forming material.

8. The method as claimed in claim 5, wherein the etching the first insulating layer, the second insulating layer, and the third insulating layer further comprises dry-etching the first, second, and third insulating layers.

9. The method as claimed in claim 1, wherein the forming a pixel electrode and the forming a bridge electrode are performed in substantially a same process.

* * * * *